United States Patent
Park et al.

(10) Patent No.: US 11,973,315 B2
(45) Date of Patent: *Apr. 30, 2024

(54) VCSEL WITH INTEGRATED ELECTRODES

(71) Applicant: APPLE INC., Cupertino, CA (US)

(72) Inventors: Jae Y. Park, Newark, CA (US);
Arnaud Laflaquière, Paris (FR);
Christophe Vérove, Grenoble (FR); Fei Tan, San Jose, CA (US)

(73) Assignee: APPLE INC., Cupertino, CA (US)

( * ) Notice: Subject to any disclaimer, the term of this patent is extended or adjusted under 35 U.S.C. 154(b) by 156 days.

This patent is subject to a terminal disclaimer.

(21) Appl. No.: 17/706,651

(22) Filed: Mar. 29, 2022

(65) Prior Publication Data
US 2022/0224078 A1   Jul. 14, 2022

Related U.S. Application Data

(63) Continuation of application No. 16/792,317, filed on Feb. 17, 2020, now Pat. No. 11,322,910.
(Continued)

(51) Int. Cl.
*H01S 5/183* (2006.01)
*H01S 5/30* (2006.01)
(Continued)

(52) U.S. Cl.
CPC ...... *H01S 5/18308* (2013.01); *H01S 5/18358* (2013.01); *H01S 5/18366* (2013.01);
(Continued)

(58) Field of Classification Search
CPC ............ H01S 5/18308; H01S 5/18366; H01S 5/18369; H01S 5/3095; H01S 5/34313; H01S 5/426
See application file for complete search history.

(56) References Cited

U.S. PATENT DOCUMENTS

| 5,867,513 A | 2/1999 | Sato |
| 5,940,113 A | 8/1999 | Wilson |

(Continued)

FOREIGN PATENT DOCUMENTS

| CN | 106654860 A | 5/2017 |
| CN | 104752952 B | 5/2018 |

(Continued)

OTHER PUBLICATIONS

U.S. Appl. No. 17/228,742 Office Action dated May 1, 2023.
(Continued)

*Primary Examiner* — Yuanda Zhang
(74) *Attorney, Agent, or Firm* — KLIGLER & ASSOCIATES PATENT ATTORNEYS LTD.

(57) ABSTRACT

An optoelectronic device includes a carrier substrate and a lower distributed Bragg-reflector (DBR) stack disposed on an area of the substrate and including alternating first layers. A set of epitaxial layers disposed over the lower DBR includes a quantum well structure. An upper DBR stack disposed over the set of epitaxial layers includes alternating second layers. Electrodes apply an excitation current to the quantum well structure. At least one of the electrodes includes a metal ring disposed at an inner side of at least one of the DBR stacks in proximity to the quantum well structure. One or more metal vias pass through the at least one of the DBR stacks so as to connect the metal ring at the inner side of the at least one of the DBR stacks to an electrical contact on an outer side of the at least one of the DBR stacks.

20 Claims, 13 Drawing Sheets

Related U.S. Application Data

(60) Provisional application No. 62/808,314, filed on Feb. 21, 2019.

(51) Int. Cl.
  *H01S 5/343* (2006.01)
  *H01S 5/42* (2006.01)

(52) U.S. Cl.
  CPC ........ *H01S 5/18369* (2013.01); *H01S 5/3095* (2013.01); *H01S 5/34313* (2013.01); *H01S 5/426* (2013.01)

(56) References Cited

U.S. PATENT DOCUMENTS

| | | | |
|---|---|---|---|
| 6,327,287 | B1 | 12/2001 | Kner et al. |
| 6,459,556 | B1 | 10/2002 | Taguchi |
| 10,283,933 | B1 | 5/2019 | Feng et al. |
| 11,322,910 | B2 * | 5/2022 | Park ............... H01S 5/0217 |
| 11,335,794 | B2 | 5/2022 | Kim |
| 2017/0256914 | A1 | 9/2017 | Hsu et al. |
| 2019/0346641 | A1 | 11/2019 | Schlepple et al. |
| 2020/0169065 | A1 | 5/2020 | Carson et al. |

FOREIGN PATENT DOCUMENTS

| | | |
|---|---|---|
| CN | 110011181 A | 7/2019 |
| CN | 113823628 A | 12/2021 |
| WO | 2007027196 A2 | 3/2007 |
| WO | 2018053378 A1 | 3/2018 |

OTHER PUBLICATIONS

CN Application # 202011405245.4 Office Action dated Jul. 6, 2023.
U.S. Appl. No. 16/812,411 Office Action dated Apr. 12, 2022.
U.S. Appl. No. 16/331,991 Office Action dated Apr. 15, 2022.
EP Application # 17772843.3 Office Action dated Apr. 7, 2022.
JP Application # 2020159986 Office Action dated May 16, 2022.
KR Application # 1020217026188 Office Action dated Aug. 11, 2022.
Shi et al., "Numerical Study of the Optical Saturation and Voltage Control of a Transistor Vertical-Cavity Surface-Emitting Laser," IEEE Photonics Technology Letters, vol. 20, No. 24, pp. 2141-2143, Dec. 15, 2008.
Then et al., "The Transistor Laser: Theory and Experiment," Proceedings of the IEEE, vol. 101, No. 10, pp. 2271-2298, Oct. 2013.
Zhou et al., "Monolithic Optoelectronic Switch Integrating a GaAs/AlGaAs Heterojunction Bipolar Transistor and a Vertical Cavity Surface Emitting Laser," Proceedings of LEOS'93, pp. 490-491, year 1993.
U.S. Appl. No. 17/228,742 Office Action dated Dec. 29, 2023.
CN Application # 2020800129425 Office Action dated Feb. 7, 2024.

* cited by examiner

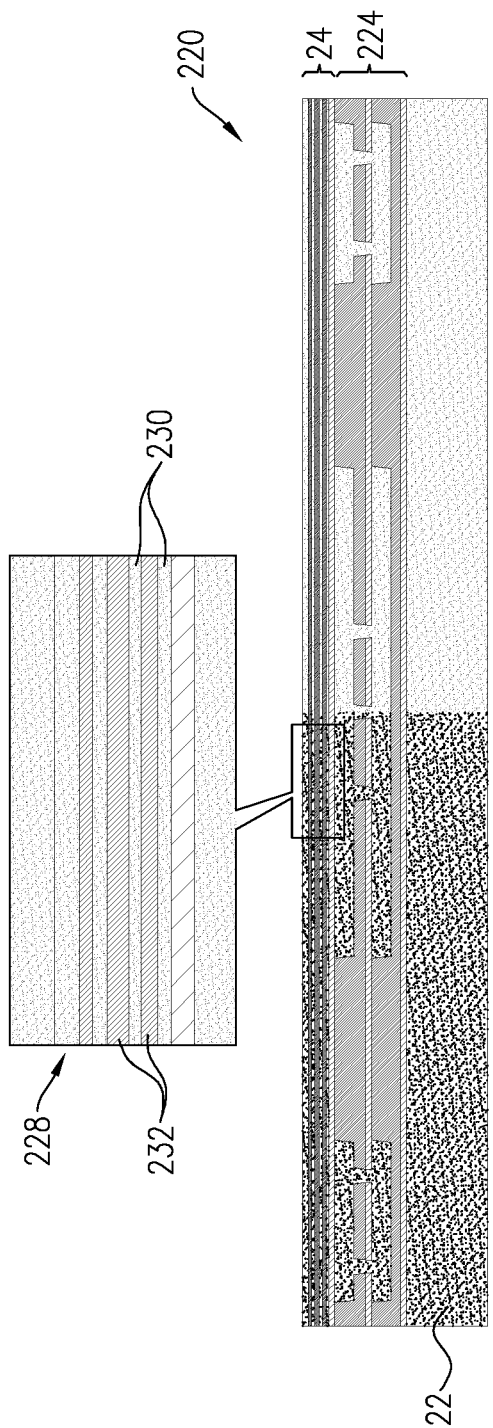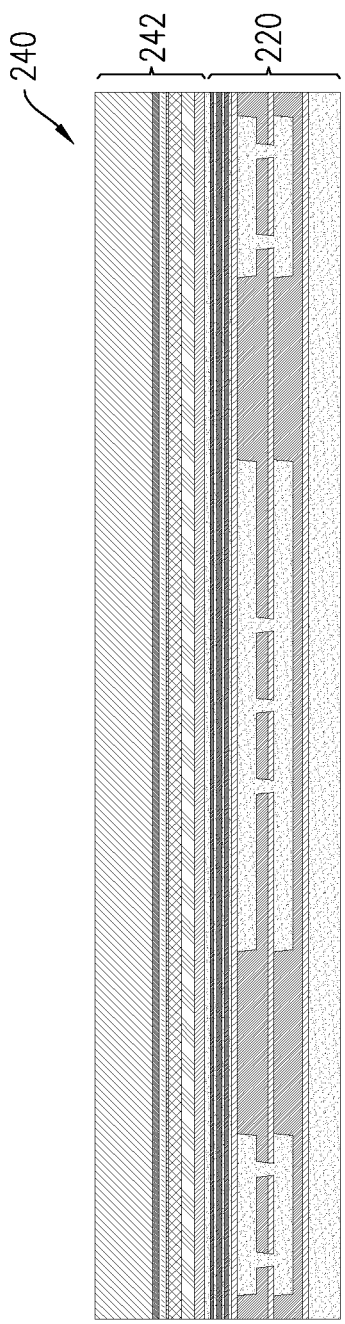

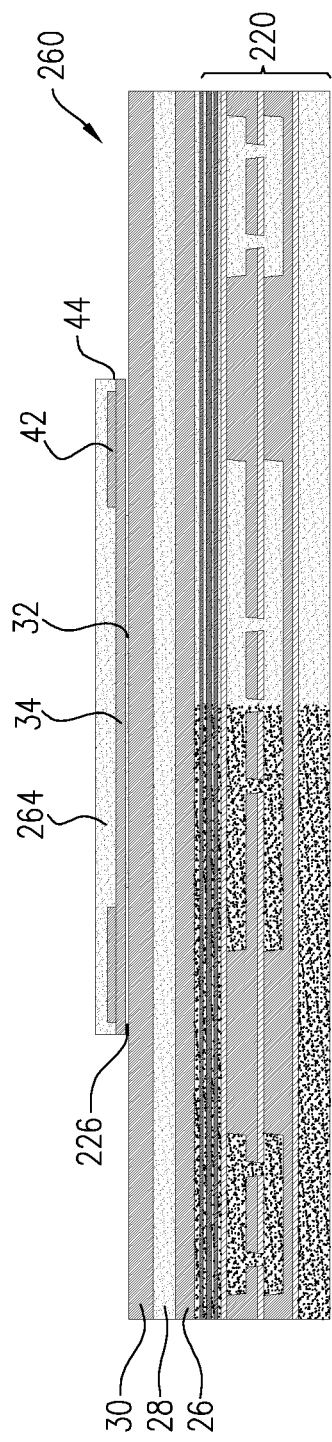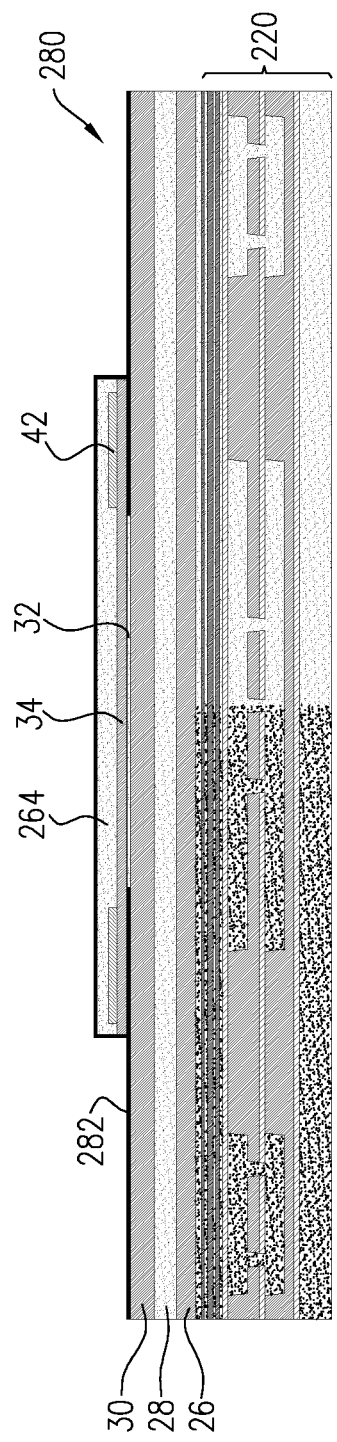

VCSEL WITH INTEGRATED ELECTRODES

CROSS-REFERENCE TO RELATED APPLICATION

This application is a continuation of U.S. patent application Ser. No. 16/792,317, filed Feb. 17, 2020, which claims the benefit of U.S. Provisional Patent Application 62/808,314, filed Feb. 21, 2019, which is incorporated herein by reference.

FIELD OF THE INVENTION

The present invention relates generally to semiconductor devices, and particularly to optoelectronic devices and their manufacture.

BACKGROUND

VCSELs (vertical-cavity surface-emitting lasers) are semiconductor lasers, wherein the highly directional laser radiation is emitted from the top or bottom of the laser in a direction perpendicular to the substrate. VCSELs are manufactured either as single lasers or as laser arrays, and they are capable of high emission powers.

SUMMARY

Embodiments of the present invention that are described hereinbelow provide improved methods for manufacturing VCSELs, as well as VCSELs produced by such methods.

There is therefore provided, in accordance with an embodiment of the invention, an optoelectronic device, including a carrier substrate and a lower distributed Bragg-reflector (DBR) stack disposed on an area of the substrate and including alternating first dielectric and semiconductor layers. A set of epitaxial layers is disposed over the lower DBR, wherein the set of epitaxial layers includes one or more III-V semiconductor materials and defines a quantum well structure and a confinement layer. An upper DBR stack is disposed over the set of epitaxial layers and includes alternating second dielectric and semiconductor layers. Electrodes are coupled to apply an excitation current to the quantum well structure.

In some embodiments, the carrier substrate includes a silicon (Si) wafer. In a disclosed embodiment, the device includes complementary metal oxide semiconductor (CMOS) circuits formed on the Si wafer and coupled to drive the electrodes.

In one embodiment, the alternating first dielectric and semiconductor layers include alternating layers of silicon dioxide ($SiO_2$) and amorphous silicon (a-Si). Alternatively, the alternating first dielectric and semiconductor layers include alternating layers of aluminum nitride (AlN) and a-Si.

In a disclosed embodiment, the III-V semiconductor materials are selected from a group of materials consisting of indium phosphide (InP), indium-gallium-arsenide (InGaAs), and indium-gallium-arsenide-phosphide (InGaAsP) aluminum-gallium-indium-arsenide (AlGaInAs) and aluminum-gallium-arsenide-antimonide (AlGaAsSb).

In some embodiments, the confinement layer includes a central part including a III-V semiconductor material, and a peripheral part surrounding the central part and including a dielectric material. In one embodiment, the peripheral part includes aluminum oxide ($Al_2O_3$). Additionally or alternatively, the confinement layer includes a buried tunnel junction.

In a disclosed embodiment, the second dielectric and semiconductor layers include alternating layers of $SiO_2$ and amorphous silicon.

In some embodiments, at least one of the electrodes includes a metal ring disposed in proximity to the quantum well structure. In a disclosed embodiment, the device includes one or more metal vias passing through at least one of the DBR stacks so as to connect the metal ring at an inner side of the at least one of the DBR stacks to an electrical contact on an outer side of the at least one of the DBR stacks.

There is also provided, in accordance with an embodiment of the invention, a method for fabricating an optoelectronic device, the method including depositing a set of epitaxial layers including III-V semiconductor materials on a III-V substrate so as to form a quantum well structure. A confinement layer is formed over the quantum well structure. Alternating first dielectric and semiconductor layers are deposited so as to form a lower distributed Bragg-reflector (DBR) stack. The III-V substrate is bonded to a carrier substrate so that the lower DBR stack is positioned between the quantum well structure and the carrier substrate, and then removing the III-V substrate. After removing the III-V substrate, alternating second dielectric and semiconductor layers are deposited over the set of epitaxial layers so as to form an upper DBR stack. Electrodes are coupled to apply an excitation current to the quantum well structure.

In one embodiment, forming the confinement layer includes laterally etching one of the epitaxial layers, so that the confinement layer includes a central part including a III-V semiconductor material and a peripheral part including a dielectric material surrounding the central part. Alternatively, forming the confinement layer patterning and then regrowing one of the epitaxial layers so as to form a buried tunnel junction in a central part of the one of the epitaxial layers.

In a disclosed embodiment, depositing the alternating first dielectric and semiconductor layers includes forming the lower DBR stack on the carrier substrate, and bonding the III-V substrate includes bonding the set of epitaxial layers to the lower DBR stack on the carrier substrate. Alternatively, depositing the alternating first dielectric and semiconductor layers includes forming the lower DBR stack on the III-V substrate over the set of epitaxial layers and the confinement layer, and bonding the III-V substrate includes bonding lower DBR stack on the III-V substrate to the carrier substrate.

In some embodiments, coupling the electrodes includes depositing a metal ring over at least one side of the quantum well structure, before forming the upper DBR stack. In a disclosed embodiment, coupling the electrodes includes forming one or more metal vias passing through at least one of the DBR stacks so as to connect the metal ring at an inner side of the at least one of the DBR stacks to an electrical contact on an outer side of the at least one of the DBR stacks.

The present invention will be more fully understood from the following detailed description of the embodiments thereof, taken together with the drawings in which:

BRIEF DESCRIPTION OF THE DRAWINGS

FIG. 4 is a schematic sectional view of a structure after a CMOS step and a lower DBR deposition step, in accordance with an embodiment of the invention;

FIG. 5 is a schematic sectional view of a structure after a bonding step, in accordance with an embodiment of the invention;

FIG. 6 is a schematic sectional view of a structure after a lateral etch step, in accordance with an embodiment of the invention;

FIG. 7 is a schematic sectional view of a structure after a gap fill step, in accordance with an embodiment of the invention;

DETAILED DESCRIPTION OF EMBODIMENTS

Overview

Figure 1:
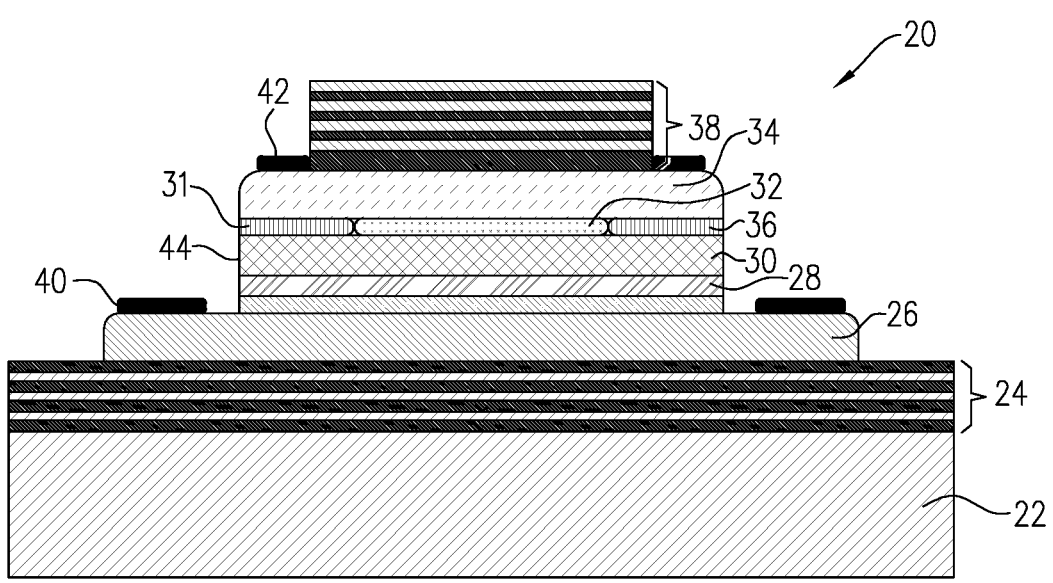
FIG. 1 is a schematic sectional view of a VCSEL, in accordance with an embodiment of the invention.

Vertical-cavity surface-emitting lasers (VCSELs) based on indium phosphide (InP) are capable of emitting light in the wavelength range from 1350 nm to 2000 nm. (The terms "optical radiation" and "light" as used in the present description and in the claims refer generally to any and all of visible, infrared, and ultraviolet radiation.) The InP-chips carrying the VCSELs can be bonded to a carrier substrate, such as a silicon (Si) substrate in order to take advantage of the complementary metal-oxide semiconductor (CMOS) control circuits on a Si-wafer. (The term "substrate" as used in the present description and in the claims can refer either to a complete wafer or to a part of a wafer, such as in a semiconductor chip.)

InP-based VCSELs can be fabricated by first depositing a lower reflector over the Si-substrate. The reflector may comprise either a distributed Bragg-reflector (DBR) stack or a photonic crystal mirror (PCM), and is generally designed to have a reflectivity exceeding 99% at the laser wavelength. A DBR comprises repetitive pairs of high- and low-index materials, wherein the thickness of each layer is a quarter of the local wavelength of the light emitted by the VCSEL (i.e., the free-space wavelength divided by the index of refraction of the material at the wavelength). A PCM comprises periodic optical nanostructures, whose band-gap can be tailored so that the PCM functions as a high-reflectivity mirror.

Next, epitaxial layers, comprising InP-layers and a multiple quantum well (MQW) stack, are deposited over the lower reflector to form the active region of the VCSEL. An InP-based MQW stack may comprise (but is not limited to) $In_xGa_{1-x}As$, $In_xAl_yGa_{1-x-y}As$, $In_xGa_{1-x}As_yP_{1-y}$ and/or $In_xGa_{1-x}As_yN_{1-y}$, wherein $0 \leq x$, $y \leq 1$. The barrier material can comprise (but is not limited to) InP, $In_aAl_{1-a}As$, $In_aAl_bGa_{1-a-b}As$, $In_aGa_{1-a}As_bP_{1-b}$, and/or $In_aGa_{1-a}As_bN_{1-b}$, wherein $0 \leq a$, $b \leq 1$. The typical thickness of each of the quantum well and barrier layers is in the nanometer range (for example, between 1 and 15 nm). The typical number of quantum well layers can be in the range of 3 to 15, with similar numbers of barrier layers. Then an upper reflector, similar to the lower reflector (but typically with lower reflectivity), is deposited over the epitaxial layers, and electrodes are deposited and patterned on the epitaxial layers so as to apply an excitation current to the MQW.

Advanced VCSELs employ methods and structures to confine both the electrical current and the optical radiation within the VCSEL. Confinement of the electrical current brings the carriers into a well-defined volume within the central area in the MQW stack of the VCSEL, and the optical confinement controls the spatial modes of the optical radiation generated by the VCSEL. One method for confining the electrical current in InP-based VCSELs comprises implanting protons in areas around the desired current path. Another method uses a laterally-etched buried tunnel junction (BTJ) for both optical and electrical confinement. VCSELs utilizing PCMs may confine the optical radiation by selectively modifying the photonic crystal structure.

Good thermal conductivity between the VCSEL and the substrate is important in order to carry away the heat generated by the VCSEL excitation current. The thermal conductivity may suffer based on the choice of the materials and thicknesses of the lower reflector and other layers at the VCSEL/substrate interface.

Optimizing the performance of InP-based VCSELs calls for a high degree of both electrical and optical confinement, as well good thermal conductivity from the VCSEL to the substrate. The embodiments of the present invention that are described herein address these needs so as to enable the fabrication of InP-based VCSELs with high output power and high efficiency, as well as good optical mode confinement.

The disclosed embodiments combine, in an InP-based epitaxial stack, an MQW stack comprising a confinement layer and having lower and upper DBRs that comprise alternating layers of semiconductor and dielectric materials. Typical InP-based materials (besides InP itself) comprise, but are not limited to, $In_xGa_{1-x}As$, $In_xAl_yGa_{1-x-y}As$, $In_xGa_{1-x}As_yP_{1-y}$, $In_xGa_{1-x}As_yN_{1-y}$, $Al_xGa_{1-x}As_ySb_{1-y}$, $In_aAl_{1-a}As$, $In_aAl_bGa_{1-a-b}As$, $In_aGa_{1-a}As_bP_{1-b}$ and $In_aGa_{1-a}As_bN_{1-b}$. The confinement layer, which optionally comprises a BTJ, is etched laterally, thus generating a space in the peripheral part surrounding the central part (core) of the MQW. The generated space can subsequently be filled with a dielectric material, which confines both the electrical currents and the optical field into the central core.

A lower DBR comprising alternating layers of commonly used semiconductor and dielectric materials provides inherently good thermal conductivity from the VCSEL into the substrate. In some embodiment, a dielectric material, such as aluminum nitride (AlN), is used to further improve the thermal conductivity. Electrodes are deposited and patterned onto the epitaxial layers so as to apply an excitation current to the quantum well structure. In some embodiments, in order to enhance heat removal from the active region, one or both of the electrodes comprise metal rings disposed in proximity to the quantum well structure. One or more metal vias pass through one or both of the DBR stacks so as to connect the metal ring at the inner side of the DBR stack to an electrical contact on the outer side of the DBR stack.

Although the disclosed embodiments use an epitaxial stack based on InP, other III-V semiconductor materials, such as gallium-arsenide (GaAs) and gallium-aluminum-arsenide (GaAlAs), may alternatively be used. Additionally or alternatively GaSb and/or GaN may be used for wider spectral coverage. (For a GaSb-based system, the wavelength is around 2 µm or longer. For a GaN-based system, the wavelength is typically below 500 nm.) Furthermore, other semiconductor carrier substrates may be used instead of Si. However, Si has the benefit that, based on a well-established process technology, CMOS-circuits with very tight design rules (small lateral dimensions) may be manufactured with a high yield on the surface of the substrate and coupled to drive the VCSELs.

Device Description

FIG. 1 is a schematic sectional view of a VCSEL 20, in accordance with an embodiment of the invention.

VCSEL 20 comprises a semiconductor substrate, such as a silicon (Si) substrate 22. On Si-substrate 22 there is deposited a lower DBR 24 comprising alternating layers of semiconductor material and dielectric material, wherein the thickness of each layer is a quarter of the local wavelength of the light emitted by VCSEL 20. A sufficient number of layer-pairs is formed in order to achieve high reflectivity, for example 99% reflectivity. Lower DBR 24 may comprise, for example, alternating layers of amorphous silicon (a-Si) as the semiconductor material and silicon dioxide ($SiO_2$) as the dielectric material. Alternatively using AlN as the dielectric material, the thermal conductivity from VCSEL 20 to substrate 22 may be increased substantially over that achieved with $SiO_2$.

Above lower DBR 24 is an MQW stack 28 sandwiched between a lower contact 26, comprising n-type InP, and a p-type InP (p-InP) layer 30. As noted above, MQW stack 28 typically comprises quantum well materials such as $In_xGa_{1-x}As$, $In_xAl_yGa_{1-x-y}As$, $In_xGa_{1-x}As_yP_{1-y}$ and/or $In_xGa_{1-x}As_yN_{1-y}$, with barrier layers comprising InP, $In_aAl_{1-a}As$, $In_aAl_bGa_{1-a-b}As$, $In_aGa_{1-a}As_bP_{1-b}$ and/or $In_aGa_{1-a}As_bN_{1-b}$. Above p-InP layer 30 is a confinement layer 31, followed by an upper n-InP contact 34. Confinement layer 31 in the pictured embodiment comprises a BTJ 32 in its central part, which may be surrounded by a dielectric fill 36 in its peripheral part. BTJ 32 typically comprises a pair of $p^+$- and $n^+$-layers, with the $p^+$-layer adjacent to upper contact 34. Dielectric fill 36 typically comprises aluminum oxide ($Al_2O_3$). An upper DBR 38, comprising alternating layers of silicon nitride (SiN) and a-Si, is deposited over upper contact 34.

In an alternative embodiment (not shown in the figures), confinement layer 31 comprises, for example, a laterally-etched p-type semiconductor layer, without a BTJ, and upper contact 34 may also comprise p-type material. The changes needed in the process described below in order to accommodate this alternative sort of confinement layer will be apparent to those skilled in the art.

VCSEL 20 has been etched to generate a mesa-type structure with a sidewall 44. Mesa-type structure of VCSEL 20 is typically cylindrical, and consequently sidewall 44 is a continuous cylindrical surface. However, alternative embodiments may use other shapes of the mesa-type structure, such as, for example, cubical, and consequently the mesa-type structure may have several sidewalls. Cathode and anode electrodes 40 and 42 have been deposited and patterned on lower and upper contact layers 26 and 34, respectively, to provide excitation current paths for VCSEL 20. Again, due to the cylindrical mesa-type structure, electrodes 40 and 42 are concentric rings.

A more detailed description of the structure and fabrication process of VCSEL 20 is provided in FIGS. 2-9, below.

Method of Fabrication

Figure 2A:
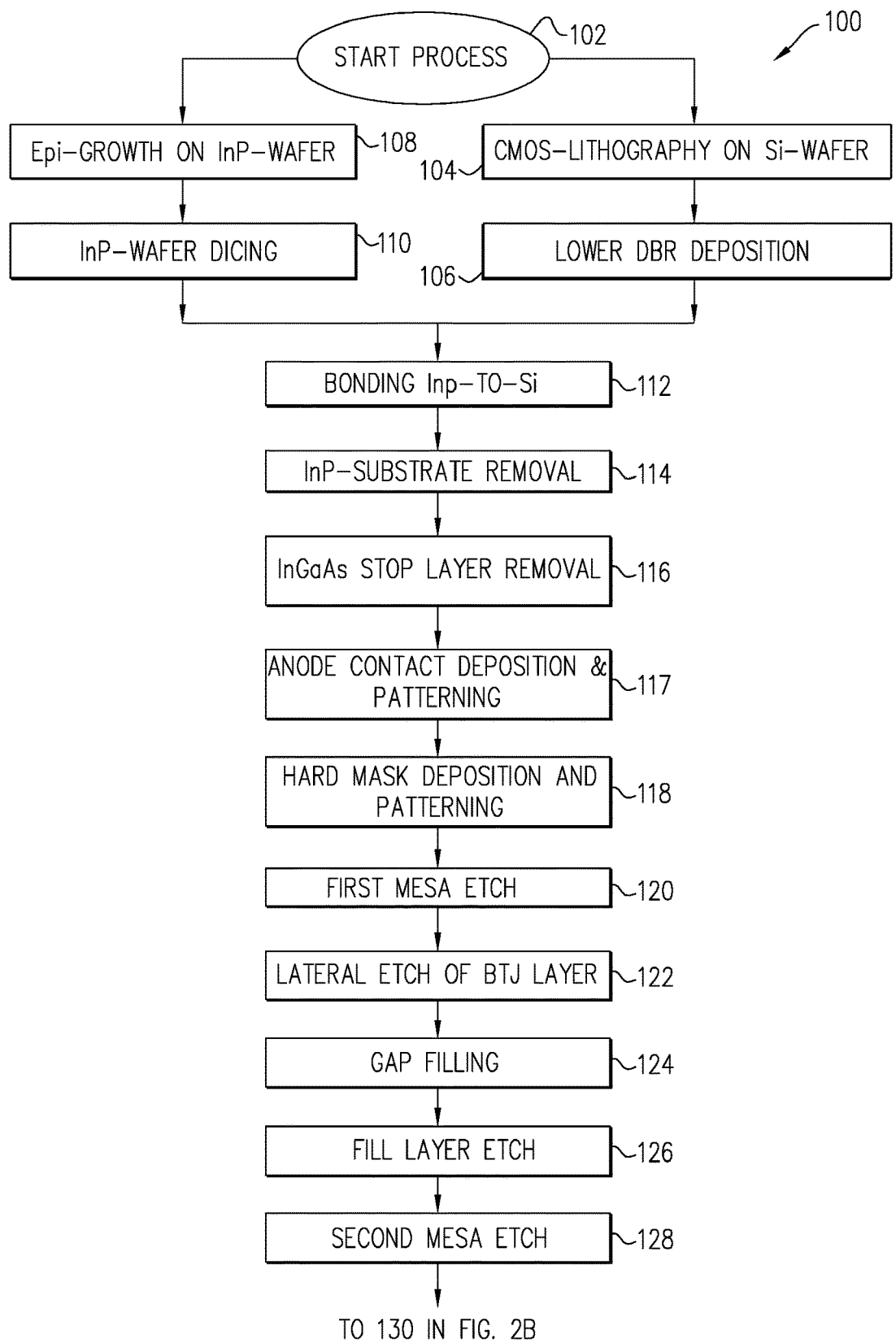
FIGS. 2A and 2B are flowcharts that schematically illustrate the fabrication process of a VCSEL, in accordance with an embodiment of the invention.
Figure 2B:
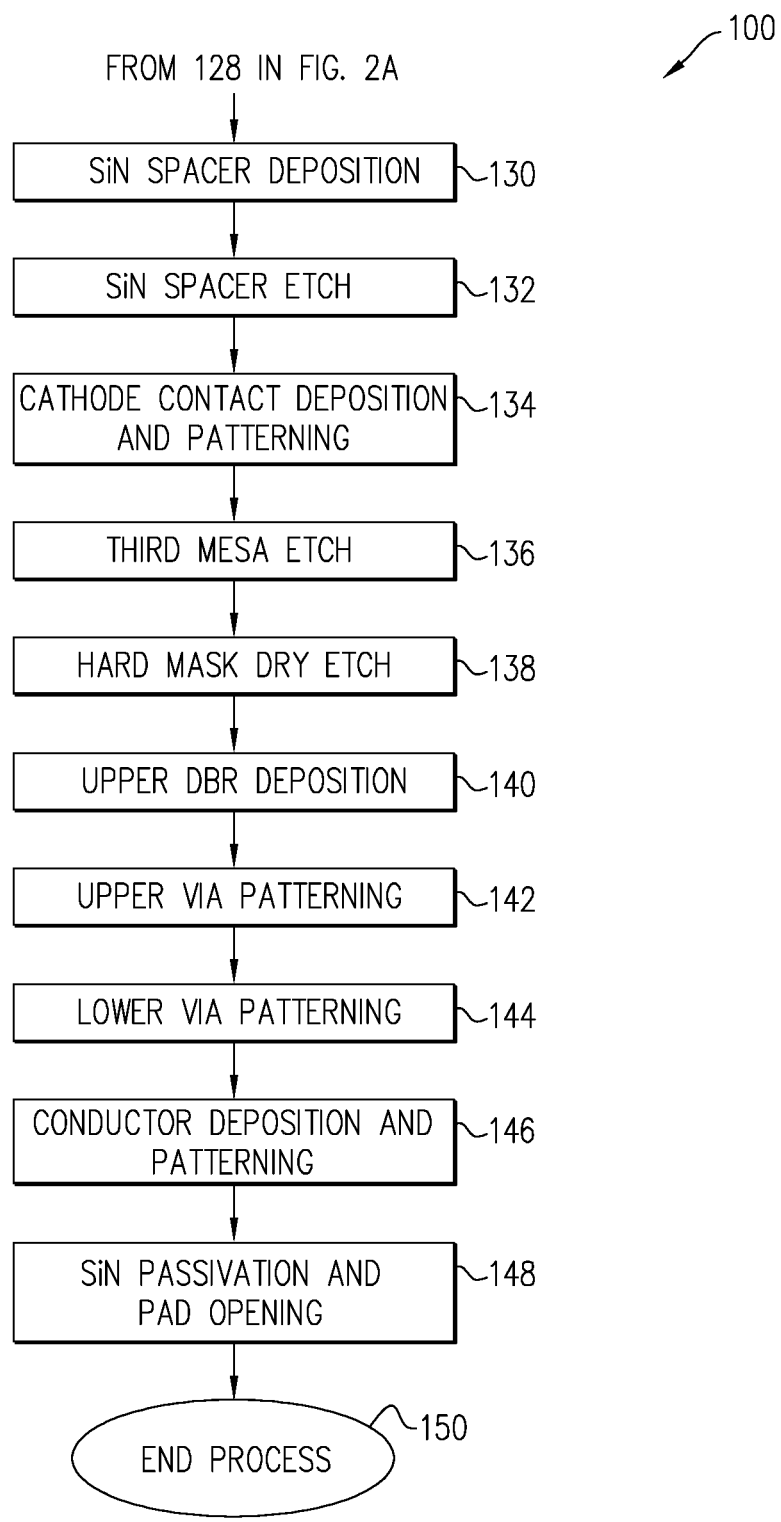

FIGS. 2A and 2B together present a flowchart 100 that schematically illustrates the fabrication process of VCSEL 20, in accordance with an embodiment of the invention. Sectional views of structures created in key process steps are shown in FIGS. 3-9, and they will be referred to at the appropriate steps of flowchart 100. In this embodiment, lower DBR 24 is formed by deposition of layers on Si-substrate 22 (the carrier substrate), while the epitaxial layers making up the active region of the VCSEL are deposited on a III-V substrate, such as in InP substrate, and are then bonded to the lower DBR. In alternative embodiments, as described below with reference to FIGS. 10A/B and 12, the lower DBR is formed on the III-V substrate over the set of epitaxial layers and the confinement layer, this lower DBR on the III-V substrate is then bonded to the carrier substrate.

The fabrication process starts with a start step 102, from which the fabrication process initially follows two parallel paths. In a CMOS step 104, CMOS circuits 224 are fabricated on Si-substrate 22 (FIGS. 1 and 4). In a lower DBR deposition step 106, a multilayer structure comprising alternating layers of $SiO_2$ and a-Si, with quarter-wave thicknesses at the VCSEL 20 wavelength, is deposited over Si-substrate 22 forming lower DBR 24. The deposition can be performed, for example, by PVD (Physical Vapor Deposition), CVD (Chemical Vapor Deposition), or PECVD (Plasma-Enhanced CVD), or other methods such as ALD (Atomic Layer Deposition), MOCVD (metal organic CVD), MBE (molecular beam epitaxy), or CBE (chemical beam epitaxy). A resulting structure 220 is detailed in FIG. 4. In an epi-growth step 108, epitaxial layers are grown on an InP-wafer 202 (beginning with an InGaAs etch-stop layer 204), as is detailed in FIG. 3. In a dicing step 110, InP-wafer 202 is diced into chips, wherein each chip will later become VCSEL 20. The two paths of steps 104-106 and steps 108-110 converge in a bonding step 112, wherein each InP-chip is flipped over and bonded to Si-substrate 22. A resulting structure 240 is detailed in FIG. 5.

Figure 3:
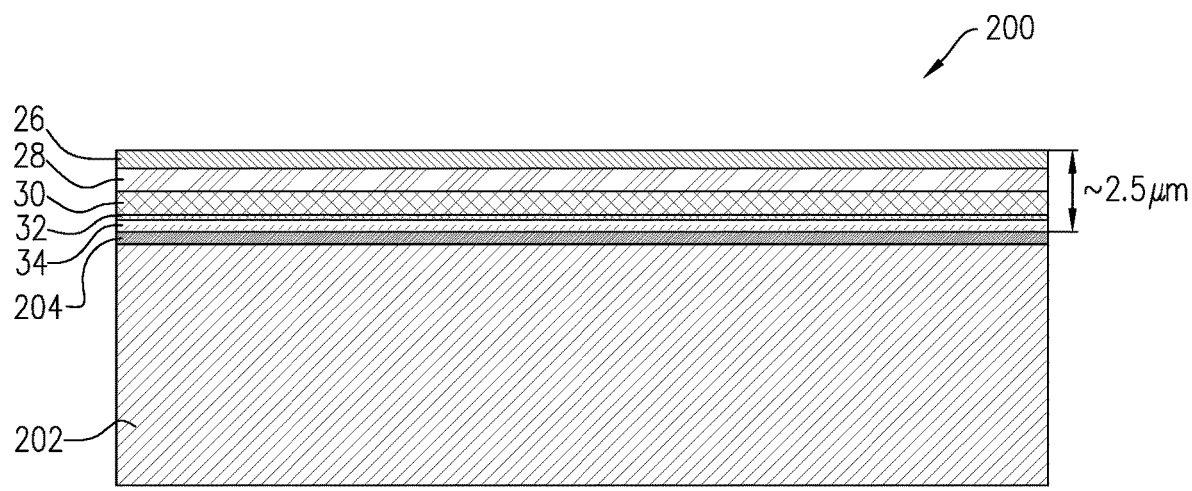
FIG. 3 is a schematic sectional view of a structure after an epi-growth step, in accordance with an embodiment of the invention.

In a substrate removal step 114, the remaining part of InP-wafer 202 is removed, down to etch-stop layer 204. In a stop layer removal step 116, layer 204, shown in FIG. 3, is removed. In an anode electrode step 117, a metal layer is deposited and patterned to form anode electrode 42. In a hard mask deposition step, an $SiO_2$ hard mask 264, shown in FIG. 6, is deposited and patterned over upper contact 34. In a first mesa etch step 120, a partial mesa with sidewall 44 is etched down to p-InP layer 30.

As shown in FIG. 6, in a lateral etch step 122, BTJ 32 is etched so that it remains in place only in the core part of VCSEL 20, and a gap 226 is hollowed out between upper contact 34 and p-InP layer 30. As shown in FIG. 7, in a gap fill step 124, a fill layer 282 of dielectric material, such as Al$_2$O$_3$, is deposited over the entire structure using atomic layer deposition (ALD).

In a fill layer etch step 126, most of fill layer 282 is etched away, leaving only the material filling gap 226, as well as some material around the previously etched mesa. In a second mesa etch step 128, the previously etched mesa sidewall 44 is continued down to lower contact 26. In a SiN spacer deposition step 130 and in a SiN spacer etch step 132, a SiN-layer is respectively deposited and then etched to form a SiN spacer 304 around the side of the mesa, as shown in FIG. 8.

Figure 8:
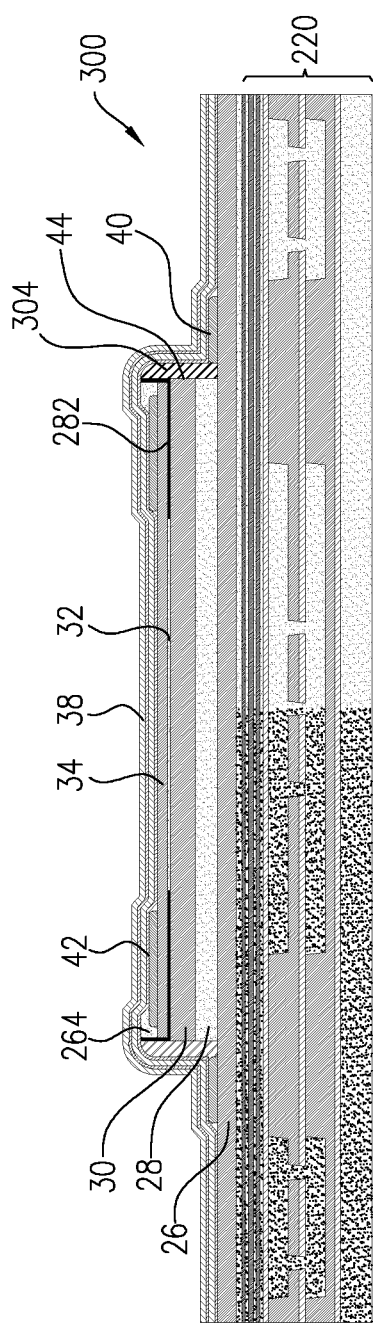
FIG. 8 is a schematic sectional view of a structure after an upper DBR deposition step, in accordance with an embodiment of the invention.
Figure 9:
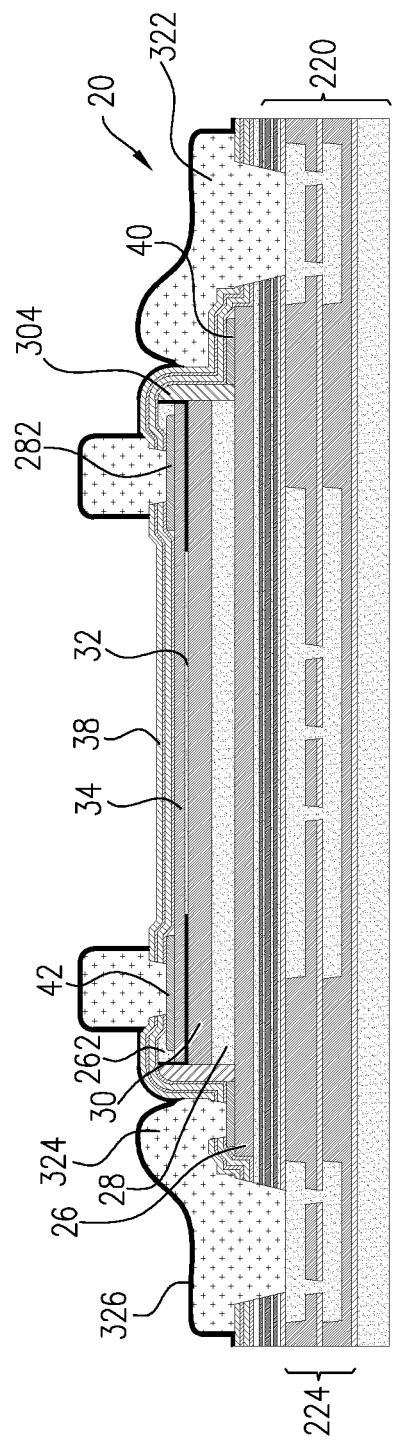
FIG. 9 is a schematic sectional view of a completed VCSEL after a passivation step, in accordance with an embodiment of the invention.

With further reference to FIG. 8, in a cathode electrode step 134, cathode electrode 40 is deposited and patterned. In a third mesa etch step 136, sidewall 44 of the mesa structure is etched down to lower contact DBR 24 (as shown in FIG. 9). In a hard mask etch step 138, most of hard mask 264 is etched away. In an upper DBR deposition step 140, upper DBR 38 is deposited as alternating layers of SiN and a-Si, as detailed in FIGS. 1 and 8. In an upper via step 142, vias are opened to access cathode and anode electrodes 40 and 42, respectively. In a lower via step 144, vias are opened to access the metal layers in CMOS-circuits 224.

In a conductor deposition step 146, conductors 322 and 324 are deposited and patterned to function as RDLs (redistribution layers), connecting anode and cathode electrodes 42 and 40, respectively, to CMOS-circuits 224. In a passivation step 148, SiN is deposited over VCSEL 20, and a pad is opened through the passive layer to enable electrical contact to the chip.

An end step 150 finishes the process. At this stage Si-substrate 22 can be diced to produce chips with single VCSELs or arrays of VCSELs.

FIG. 3 is a schematic sectional view of a structure 200 after epi-growth step 108, in accordance with an embodiment of the invention.

Structure 200 can be fabricated on a 3" InP-wafer 202, for example, but other wafer diameters may alternatively be used. First InGaAs stop layer 204 is deposited over InP-wafer 202. The following layers have been epitaxially grown over InGaAs stop layer 204: upper contact 34, BTJ 32, p-InP layer 30, MQW stack 28, and lower contact 26. A typical total thickness of the epitaxial layers is 2.5 microns. The terms "upper" and "lower" are defined by the orientation that structure 200 will have after flipping it over in bonding step 112.

FIG. 4 is a schematic sectional view of structure 220 after CMOS step 104 and lower DBR deposition step 106, in accordance with an embodiment of the invention.

Structure 220 can be fabricated on a 300 mm Si-wafer 22, for example, but other wafer diameters may alternatively be used. In CMOS step 104, using a standard CMOS-process, CMOS circuits 224 have been fabricated on Si-wafer 22. In lower DBR deposition step 106, lower DBR 24 has been deposited over CMOS circuits 224. An inset 228 shows the structure of lower DBR 24 with alternating layers of SiO$_2$ 230 and a-Si 232. The thicknesses of the layers, for example, can be 224 nm for SiO$_2$ 230 and 93 nm for a-Si 232. The number of layers can be chosen to achieve the desired level of reflectivity.

FIG. 5 is a schematic sectional view of structure 240 after bonding step 112, in accordance with an embodiment of the invention.

In bonding step 112, an InP-chip 242, produced from structure 200 in dicing step 110, is flipped over relative to the orientation shown in FIG. 3, and bonded onto structure 220 by InP-to-oxide bonding. Alternatively, direct oxide-to-oxide bonding can be used if an additional oxide layer is deposited over the InP.

FIG. 6 is a schematic sectional view of a structure 260 after lateral etch step 122, in accordance with an embodiment of the invention.

Structure 260 comprises structure 220 of FIG. 4, as well as the following remaining layers of structure 200 of FIG. 3 (listed from bottom to top): Lower contact 26, MQW stack 28, p-InP layer 30, BTJ 32, and upper contact 34. In addition, structure 260 comprises anode electrode 42 and hard mask 264. Upper contact 34 and BTJ 32 have been etched to define a partial mesa-structure with sidewall 44, and BTJ 32 has been etched laterally to hollow out gap 226 between p-InP layer 30 and upper contact 34, with only a core part of the BTJ remaining.

FIG. 7 is a schematic sectional view of a structure 280 after gap fill step 124, in accordance with an embodiment of the invention.

Structure 280 is identical to structure 260 of FIG. 6, except for the addition of fill layer 282, which has been deposited over structure 260 so as to fill conformally gap 226. Fill layer 282 comprises Al$_2$O$_3$, for example, deposited using a highly conformal ALD deposition process. Alternatively, other dielectric materials may be used.

FIG. 8 is a schematic sectional view of a structure 300 after upper DBR deposition step 140, in accordance with an embodiment of the invention.

Structure 300 comprises the same layers as structure 280 of FIG. 7, after a continued mesa etch and a partial etch of fill layer 282. In addition, structure 300 comprises cathode electrode 40 and SiN spacer 304. Upper DBR 38 has been deposited over structure 300, comprising alternating layers of SiN and a-Si.

The thickness and numbers of upper DBR layers depend on the design targets. As an example, for a 940 nm target VCSEL wavelength, the thickness of each a-Si layer is about 86 nm. Generally, the thickness of each layer is roughly equal to the wavelength/(4.0*index-of-material-at-this-wavelength). The material pairs used in the upper DBR choice can include (but are not limited to) SiN/a-Si, SiO2/a-Si, or AlN/a-Si, for example. The upper mirror reflectivity can also vary, but generally it is larger than 99%, while that of the bottom DBR is generally larger than 99.9%. To reach this reflectivity range generally requires at least three pairs of alternating SiO2/a-Si or other DBR materials. Alternatively, it is possible to use two pairs of AlN/a-Si and another two pairs of SiO2/a-Si to reach such this reflectivity range.

The layer thickness of SiN spacer 304 can be a few tens of nanometers to a few hundred nanometers, or even higher. Alternatively, the spacer layer can be made of materials other than SiN, such as (but not limited to) SiO2, AlOx, or AlN, for example.

FIG. 9 is a schematic sectional view of completed VCSEL 20 after passivation step 148, in accordance with an embodiment of the invention.

VCSEL 20 is similar to structure 300 of FIG. 8, with anode conductor 322 and cathode conductor 324 added for connecting anode electrode 42 and cathode electrode 40, respectively, to CMOS circuits 224 through vias opened in steps 142 and 144. VCSEL 20 is further coated with a SiN passivation layer 326.

Alternative Embodiments

Figure 10A:
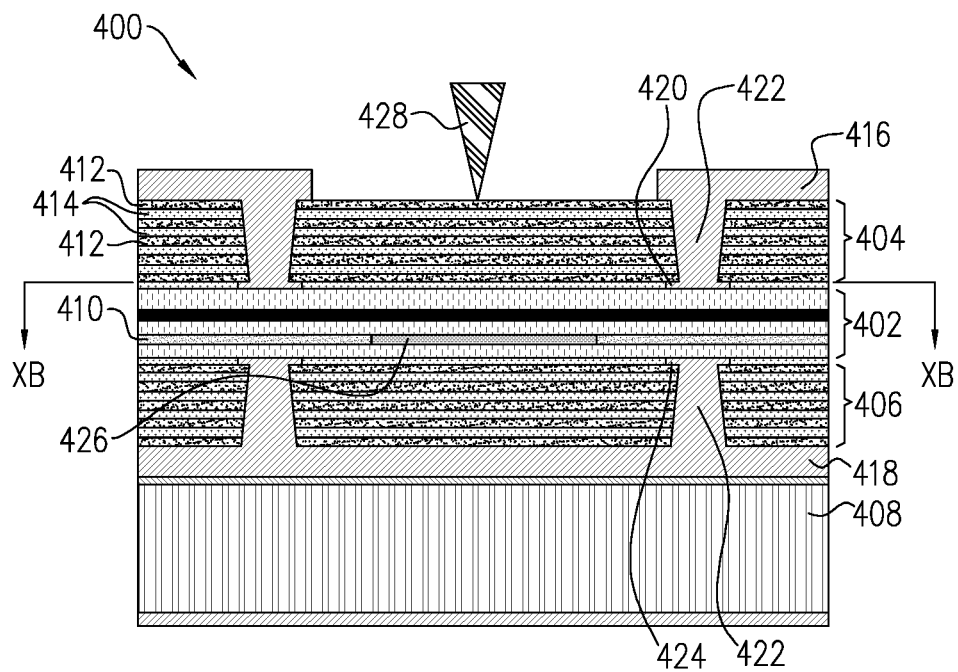
FIGS. 10A and 10B are schematic sectional views of a VCSEL, in accordance with another embodiment of the invention.
Figure 10B:
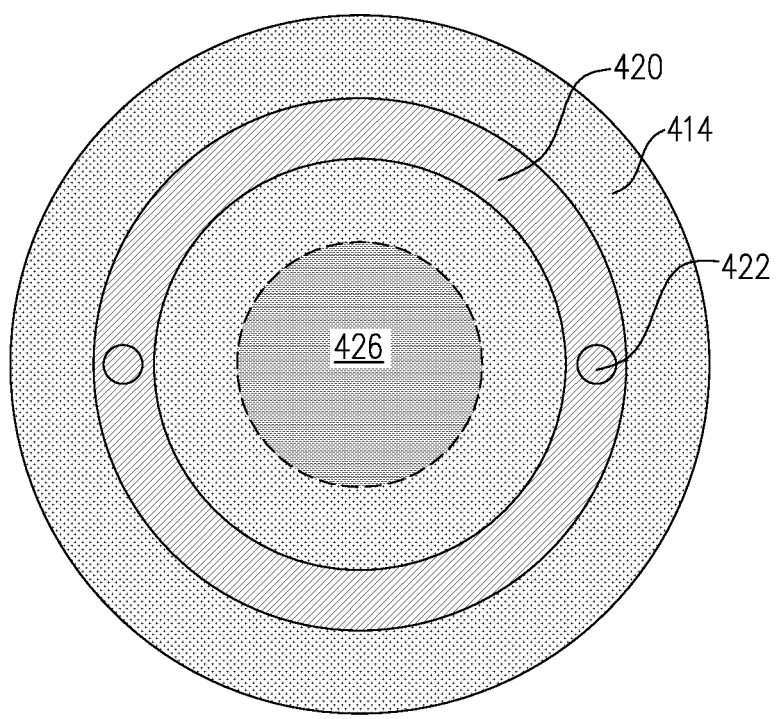
Figure 12:
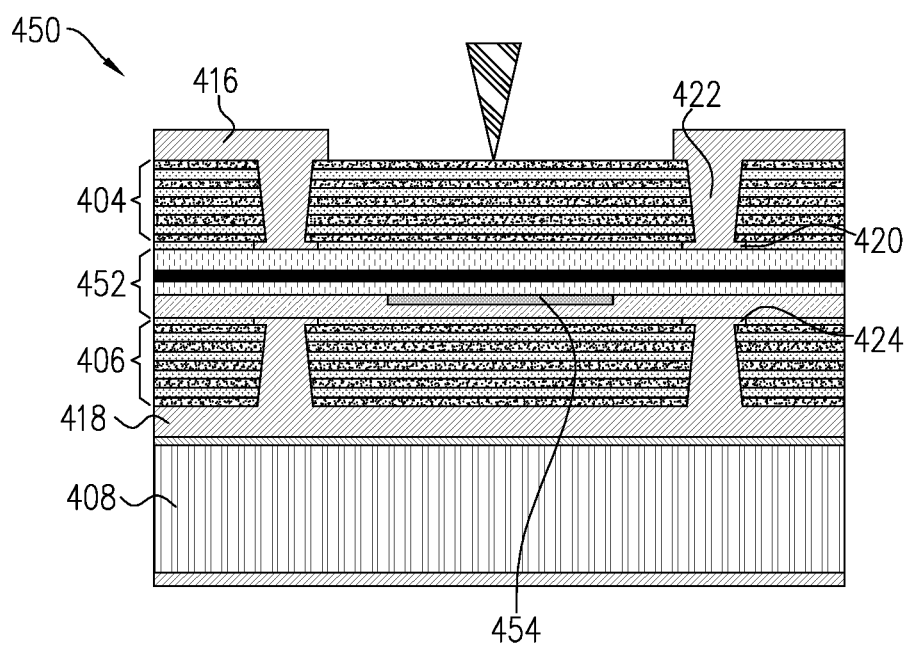
FIG. 12 is a schematic sectional view of a VCSEL, in accordance with yet another embodiment of the invention.

FIGS. 10A and 10B are schematic sectional views of a VCSEL 400, in accordance with another embodiment of the invention. FIG. 10A is a side sectional view, as in the preceding figures, while FIG. 10B is a frontal sectional view, taken along a line XB-XB in FIG. 10A. This embodiment, as well as the embodiment shown in FIG. 12, is similar in its materials and principles of structure and fabrication to the embodiment described above, with the exception of certain differences that are described below. For the sake of brevity, the description that follows will focus on these differences.

Figure 11B:
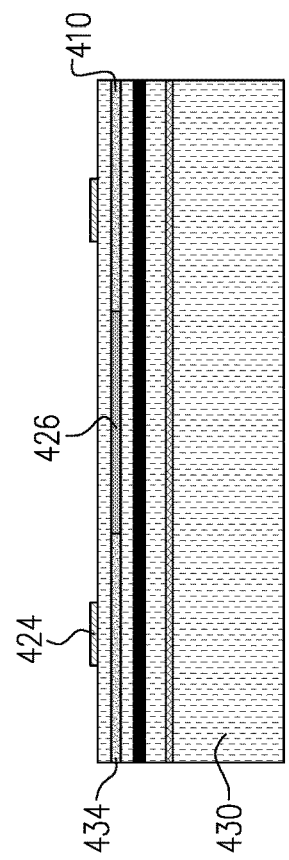
FIGS. 11A, 11B, 11C, 11D, 11E and 11F are schematic sectional views of structures formed in successive steps of a process of fabrication of the VCSEL of FIGS. 10A/B, in accordance with an embodiment of the invention.

VCSEL 400 comprises epitaxial layers making up an active region 402, including a quantum well structure and a confinement layer 410 as in the preceding embodiment. A lower DBR 406 is formed on a III-V semiconductor substrate (as shown in FIG. 11C) over the layers of active region 402, and is then bonded to a carrier substrate 408. The carrier substrate may comprise a semiconductor material, such as a Si wafer as in the preceding embodiment, or a dielectric material, such as an AlN wafer. After bonding to the carrier substrate, the III-V wafer is removed, and an upper DBR 404 is then deposited over active region 402. As in the preceding embodiment, both lower DBR 406 and upper DBR 404 comprise alternating layers 412 and 414 of a-Si and a dielectric material, such as $SiO_2$ or AlN.

Deposition of both the upper and lower DBR stacks on the III-V wafer in this manner is advantageous in terms of enhancing manufacturability and increasing the process yield, in comparison with depositing the lower DBR stack on the carrier wafer as in the preceding embodiment. Among other benefits, the design of VCSEL 400 obviates the need to handle very thin pieces of III-V wafer, thus reducing loss of yield due to wafer breakage. In the present embodiment, active region 402 can be made very thin, thus facilitating heat dissipation.

To further facilitate heat dissipation, VCSEL 400 comprises metal ring electrodes 420 and 424, in proximity to active region 402 (i.e., close to the heat-generating quantum well structure in the VCSEL). Ring electrodes 420 and 424 in the pictured embodiment are deposited below DBRs 404 and 406, respectively, and are connected by metal vias 422 through the stacks of DBR layers 412, 414 to electrical contacts 416 and 418, respectively. The ring electrodes comprise a metal with both high electrical conductivity and high thermal conductivity, for example gold. They serve the dual purposes of delivering excitation current to active region 402 and removing heat from the active region—thus reducing the junction temperature and increasing the wall-plug efficiency of the VCSEL. Although only two vias 422 are shown in the sectional view of FIG. 10B, a larger number of vias may be formed as needed for the purpose of heat dissipation. In an alternative embodiment (not shown in the figures), a ring electrode of this sort may be embedded on only one side of active region 402, with an external electrode (as in the preceding embodiment, for example) on the other side.

As in the preceding embodiment, confinement layer 410 comprises a central part 426, which comprises a III-V semiconductor material, with a peripheral part comprising a dielectric material surrounding the central part. The current flowing between electrodes 420 and 424 is channeled through this central part 426, as is the optical energy that is generated by the quantum well structure, giving rise to a well-controlled output beam 428.

FIGS. 11A, 11B, 11C, 11D, 11E and 11F are schematic sectional views of structures formed in successive steps of a process of fabrication of VCSEL 400, in accordance with an embodiment of the invention.

Figure 11A:
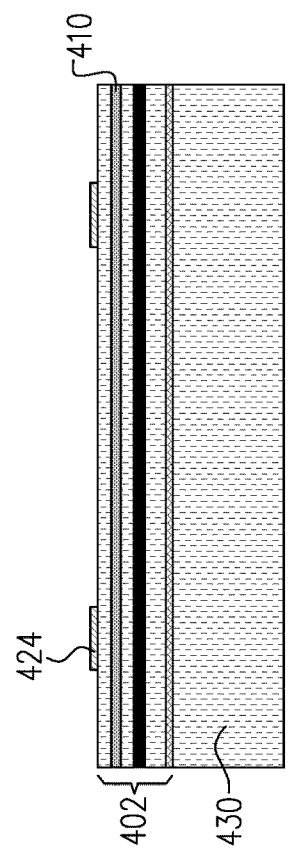

As shown in FIG. 11A, active region 402 is formed by growth of epitaxial layers on a III-V semiconductor substrate 430, such as an InP wafer. A metal layer is deposited over active region 402 and patterned to define ring electrode 424. The initial mesa etch may also be performed at this stage (as in step 120 of FIG. 2A). Confinement layer 410 is then etched laterally (as in step 122), for example in a wet etch process, to leave the semiconductor material only in central part 426. The peripheral part is filled with a dielectric material 434, for example by ALD, as shown in FIG. 11B.

Figure 11D:
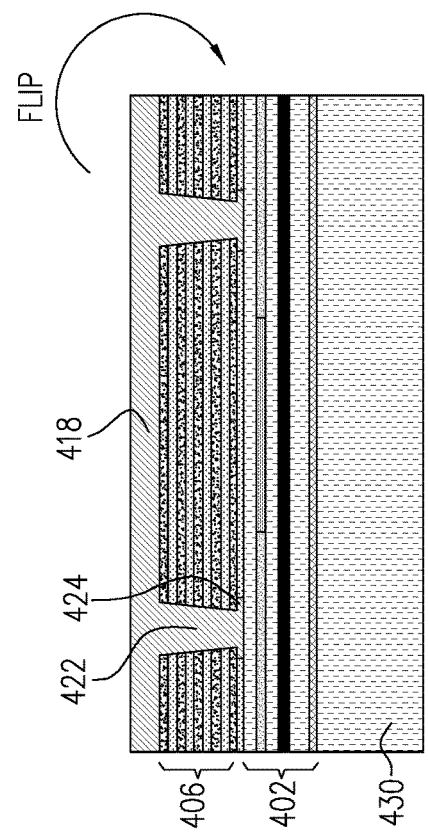
Figure 11C:
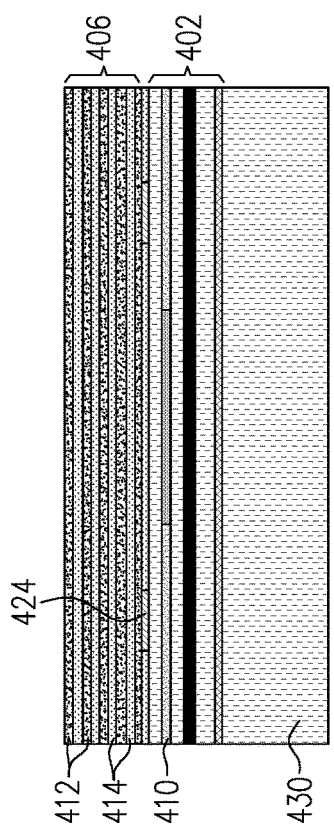

Next, as shown in FIG. 11C, lower DBR 406 is formed over active region 402 and ring electrode 424 by depositing layers 412 and 414 in alternation (along with an underlying etch-stop layer of SiN, not shown in this figure). Lower DBR 406 is patterned to define vias 422 through lower DBR 406. Following deposition and etching of a suitable barrier layer (not shown), a metal, for example gold, is deposited in the vias and over the outer surface of DBR 406. Vias 422 thus connect ring electrode 424 to electrical contact 418, both electrically and thermally, as shown in FIG. 11D.

Figure 11F:
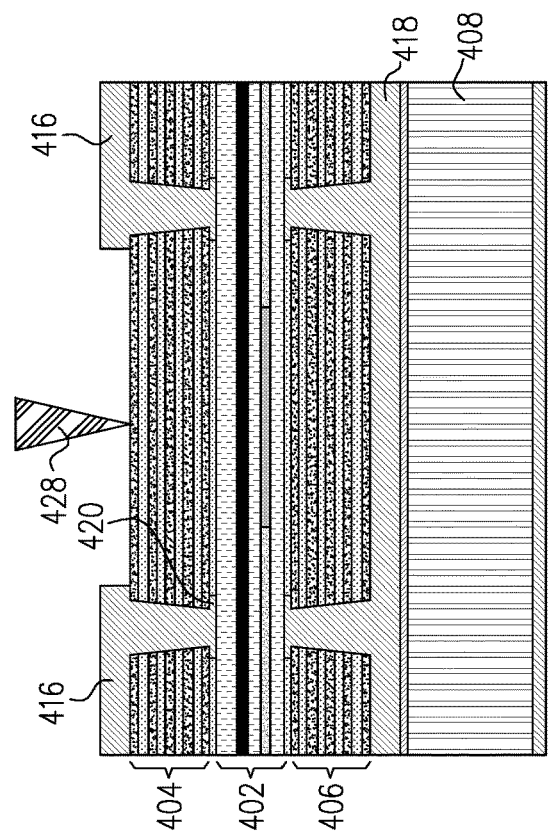
Figure 11E:
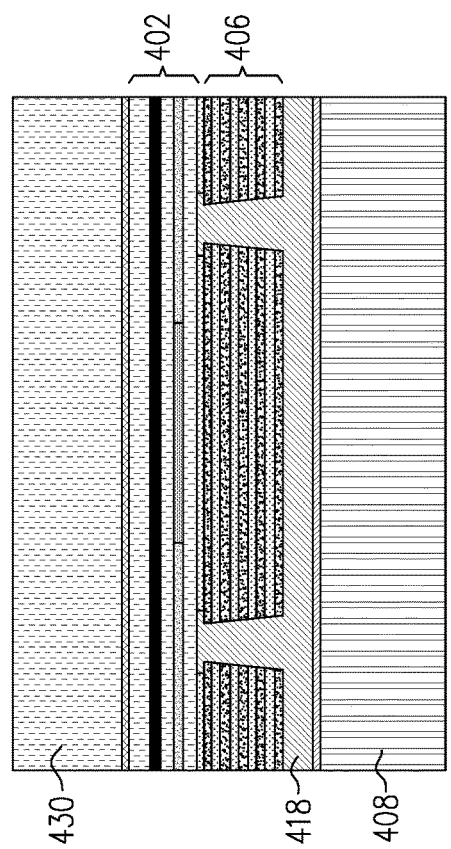

III-V semiconductor substrate 430 is now flipped and bonded to carrier wafer 408, as shown in FIG. 11E. The substrates may be bonded together, for example, by bonding the Au of electrical contact 418 to a suitable layer on the surface of the carrier wafer, such as a layer of Au or Au-containing solder, or using a suitable adhesive. Only after this bonding step is substrate 430 removed, for example by wet etching. Ring electrode 420 is then deposited on the outer surface of active region 402, followed by deposition of the stack of layers of upper DBR 404, and then etching and metal fill to form vias and electrical contact 416, as shown in FIG. 11F. These latter steps are similar to those described above with reference to FIGS. 11C and 11D, mutatis mutandis. The metal of electrical contact 416 is removed to expose the optical aperture of the VCSEL.

The inventors studied heat dissipation during operation of VCSEL 400, on the basis of the thermal properties of the materials in the VCSEL. Most of the heat in active region 402 flows laterally outward toward ring electrodes 420 and 424; and vias 422 then conduct the heat out to the upper and lower metal contact layers. In continuous wave (CW) operation of VCSEL 400 at nominal output power and room temperature, the temperature in active region 402 remains moderate, for example not exceeding about 50° C. in some designs, while the outer surfaces of DBRs 404 and 406 are substantially cooler. The cooling effect of the ring electrodes and vias enhances the electrical efficiency and lifetime of the VCSEL, as well as simplifying the process requirements for bonding and packaging of the VCSEL.

FIG. 12 is a schematic sectional view of a VCSEL 450, in accordance with yet another embodiment of the invention. VCSEL 450 is similar in its structure and principles of operation to VCSEL 400, as shown and described above, except that the confinement layer in an active region 452 of VCSEL 450 comprises a BTJ 454, which is formed by a process of epitaxial regrowth (rather than the process of lateral etch and dielectric fill as in VCSEL 400). This sort of confinement layer requires good control of the regrowth process, but avoids problems of etch inaccuracy in the lateral etching process that is used in the preceding embodiment.

Figure 13A:
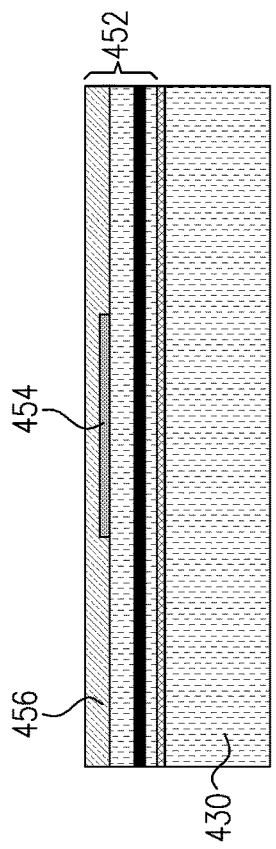
FIGS. 13A, 13B and 13C are schematic sectional views of structures formed in successive steps of a process of fabrication of the VCSEL of FIG. 12, in accordance with an embodiment of the invention.
Figure 13B:
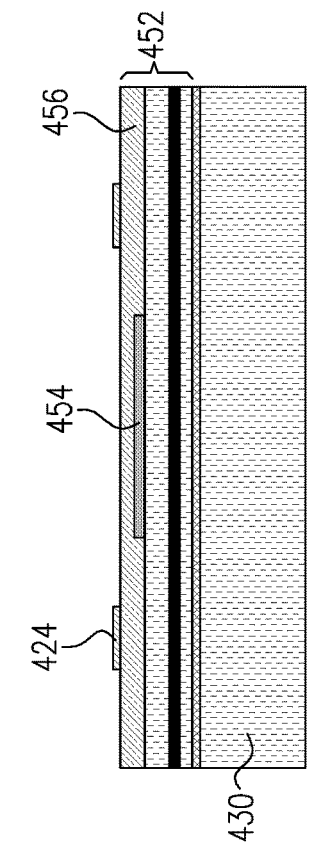
Figure 13C:
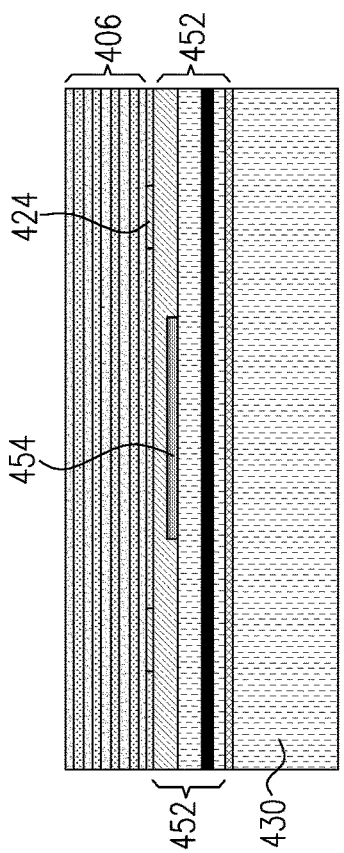

FIGS. 13A, 13B and 13C are schematic sectional views of structures formed in successive steps of a process of fabrication of VCSEL 450 (and specifically of active region 452), in accordance with an embodiment of the invention. As shown in FIG. 13A, BTJ 454 is formed by epitaxially growing a layer of heavily-doped p-type (p++) semiconductor over the lightly-doped p-type (p−) semiconductor layer above the quantum well structure of active region 452. The p++ layer is etched to a desired depth (to stop at the lightly-doped p-type semiconductor layer) and desired lateral dimensions (to form the current aperture of the VCSEL). A layer 456 of heavily-doped n-type (n++) semiconductor is then regrown over and around the patterned p++ semiconductor, thus creating the BTJ and confinement layer. A layer of metal is deposited over layer 456, and is then etched to form ring electrode 424, as shown in FIG. 13B. Lower DBR 406 is deposited over ring electrode 424 and active region 452, as shown in FIG. 13C. The process then continues in the manner described above with reference to FIGS. 11D/E/F.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
   a carrier substrate;
   a lower distributed Bragg-reflector (DBR) stack disposed on an area of the substrate and comprising alternating first layers;
   a set of epitaxial layers disposed over the lower DBR, comprising a quantum well structure;
   an upper DBR stack disposed over the set of epitaxial layers and comprising alternating second layers;
   electrodes coupled to apply an excitation current to the quantum well structure, at least one of the electrodes comprises a metal ring disposed at an inner side of at least one of the DBR stacks in proximity to the quantum well structure; and
   one or more metal vias passing through the at least one of the DBR stacks so as to connect the metal ring at the inner side of the at least one of the DBR stacks to an electrical contact on an outer side of the at least one of the DBR stacks.

2. The optoelectronic device according to claim 1, wherein the set of epitaxial layers further comprises a confinement layer.

3. The optoelectronic device according to claim 2, wherein the confinement layer comprises:
   a central part comprising a III-V semiconductor material; and
   a peripheral part surrounding the central part and comprising a dielectric material.

4. The optoelectronic device according to claim 3, wherein the peripheral part comprises aluminum oxide ($Al_2O_3$).

5. The optoelectronic device according to claim 2, wherein the confinement layer comprises a buried tunnel junction.

6. The optoelectronic device according to claim 1, wherein at least one of the lower DBR stack and the upper DBR stack comprises alternating dielectric and semiconductor layers.

7. The optoelectronic device according to claim 1, wherein the carrier substrate comprises a silicon (Si) wafer.

8. The optoelectronic device according to claim 7, and comprising complementary metal oxide semiconductor (CMOS) circuits formed on the Si wafer and coupled to drive the electrodes.

9. The optoelectronic device according to claim 1, wherein the set of epitaxial layers comprises one or more III-V semiconductor materials.

10. The optoelectronic device according to claim 9, wherein the one or more III-V semiconductor materials are selected from a group of materials consisting of indium phosphide (InP), indium-gallium-arsenide (InGaAs), indium-gallium-arsenide-phosphide (InGaAsP), aluminum-gallium-indium-arsenide (AlGaInAs) and aluminum-gallium-arsenide-antimonide (AlGaAsSb).

11. The optoelectronic device according to claim 9, wherein the one or more III-V semiconductor materials are selected from a group of materials consisting of gallium arsenide (GaAs), gallium-aluminum-arsenide (GaAlAs), gallium antimonide (GaSb) and gallium nitride (GaN).

12. The optoelectronic device according to claim 1, wherein the electrodes comprise metal rings disposed at the inner sides of both the lower DBR stack and the upper DBR stack in proximity to the quantum well structure, and the one or more metal vias comprise multiple metal vias passing through both of the lower and the upper DBR stacks so as to connect the metal rings to respective electrical contacts.

13. A method for fabricating an optoelectronic device, the method comprising:
    depositing alternating first layers on an area of a carrier substrate so as to form a lower distributed Bragg-reflector (DBR) stack;
    depositing a set of epitaxial layers so as to form a quantum well structure over the lower DBR stack;
    depositing alternating second layers over the set of epitaxial layers so as to form an upper DBR stack; and
    coupling electrodes to apply an excitation current to the quantum well structure by depositing a metal ring over at least one side of the quantum well structure at an inner side of at least one of the DBR stacks, and forming one or more metal vias passing through the at least one of the DBR stacks so as to connect the metal ring at the inner side of the at least one of the DBR stacks to an electrical contact on an outer side of the at least one of the DBR stacks.

14. The method according to claim 13, and comprising forming a confinement layer over the quantum well structure.

15. The method according to claim 14, wherein forming the confinement layer comprises laterally etching one of the epitaxial layers, so that the confinement layer comprises a central part comprising a III-V semiconductor material and a peripheral part comprising a dielectric material surrounding the central part.

16. The method according to claim 14, wherein forming the confinement layer patterning and then regrowing one of the epitaxial layers so as to form a buried tunnel junction in a central part of the one of the epitaxial layers.

17. The method according to claim 13, wherein the set of epitaxial layers comprises one or more III-V semiconductor materials.

18. The method according to claim 17, wherein the III-V semiconductor materials deposited in the set of epitaxial layers are selected from a group of materials consisting of indium phosphide (InP), indium-gallium-arsenide (InGaAs), indium-gallium-arsenide-phosphide (InGaAsP), aluminum-gallium-indium-arsenide (AlGaInAs) and aluminum-gallium-arsenide-antimonide (AlGaAsSb).

19. The method according to claim 17, wherein the one or more III-V semiconductor materials deposited in the set of epitaxial layers are selected from a group of materials consisting of gallium arsenide (GaAs), gallium-aluminum-arsenide (GaAlAs), gallium antimonide (GaSb) and gallium nitride (GaN).

20. The method according to claim 13, wherein coupling the electrodes comprises depositing metal rings at the inner sides of both the lower DBR stack and the upper DBR stack in proximity to the quantum well structure, and forming multiple metal vias passing through both of the lower and the upper DBR stacks so as to connect the metal rings to respective electrical contacts.

* * * * *